United States Patent

Meyers

[15] 3,638,133

[45] Jan. 25, 1972

[54] FEEDBACK AMPLIFIER WITH BRIDGE-STABILIZED OUTPUT IMPEDANCE

[72] Inventor: Stanley Thayer Meyers, Red Bank, N.J.

[73] Assignee: Bell Telephone Laboratories, Incorporated, Murray Hill, N.J.

[22] Filed: Apr. 10, 1970

[21] Appl. No.: 27,269

[52] U.S. Cl. ................................ 330/104, 330/108, 330/146

[51] Int. Cl. ........................................................... H03f 1/36

[58] Field of Search .................. 330/30 D, 69, 103, 104, 108, 330/146

[56] References Cited

UNITED STATES PATENTS

| | | | |
|---|---|---|---|
| 2,313,014 | 3/1943 | Hagen | 330/146 X |
| 3,423,690 | 1/1969 | Hirst | 330/146 X |

*Primary Examiner*—Robert Segal
*Assistant Examiner*—James B. Mullins
*Attorney*—R. J. Guenther and Kenneth B. Hamlin

[57] ABSTRACT

An impedance-matching arrangement comprising an operational amplifier with a bridge-stabilized output impedance transfers power between circuits having a common ground. The resulting stable gain and impedance extend over a wide frequency range and minimize impedance-matching power losses. The output impedance of the amplifier is modified to incorporate a Wheatstone bridge, three of whose arms are resistive and the fourth is the output impedance of the amplifier. One bridge diagonal feeds the grounded load circuit and the other supplies symmetrical feedback currents to the respective inputs of the amplifier.

8 Claims, 3 Drawing Figures

PATENTED JAN 25 1972 3,638,133

INVENTOR
BY S. T. MEYERS
J. P. Kearns
ATTORNEY

FEEDBACK AMPLIFIER WITH BRIDGE-STABILIZED OUTPUT IMPEDANCE

FIELD OF THE INVENTION

This invention relates to impedance-matching arrangements and in particular to such arrangements which include bridge-stabilized amplifiers.

BACKGROUND OF THE INVENTION

Transistor power amplifiers with stabilized negative feedback are often employed to deliver power to a grounded load impedance, such as a coaxial cable. In certain instances, it is necessary to match the amplifier output impedance with the grounded load impedance in order to minimize unwanted reflections. However, the output impedance of transistor amplifiers is usually low or indeterminate. One method of the prior art for matching these impedances is called "building-out." A series resistance, for instance, is added at the output of the amplifier having simple shunt negative feedback. This method necessarily results in a power loss of one-half or 6 decibels (db.). Analogously, for amplifiers having series negative feedbacks, a resistor is placed in shunt with the amplifier output, again resulting in the 6 db. power loss.

It is therefore an object of the present invention to provide an impedance match between grounded circuits without resort to building-out techniques.

It is another object of this invention to provide over a wide band of frequencies a uniform impedance match at the output of an amplifier.

It is a further object of this invention to maintain an impedance match at the output of an amplifier independently of amplifier characteristics.

It is a still further object of this invention to provide stable gain over a wide band of frequencies.

It is a still further object of this invention to minimize output power losses over a wide band of frequencies.

SUMMARY OF THE INVENTION

According to the present invention, an impedance-matching arrangement comprising a wide-band operational amplifier with a bridge-stabilized output impedance facilitates direct connections between grounded circuits. The invention comprises a high-gain amplifier with differential inputs, a resistive bridge having one branch constituted by the output impedance of the amplifier, and symmetrical feedback paths coupling the load-conjugate bridge diagonal to the differential inputs of the amplifier.

According to an illustrative embodiment of the invention, the impedance-matching arrangement comprises an operational amplifier, two feedback paths, and a quasi-Wheatstone bridge with three resistive arms and a fourth arm formed by the output impedance of the amplifier. The value of the terminating impedance is largely determined by the magnitude of the resistances at the bridge arms. An optimum choice of resistances results in a minimization of output power losses while maintaining adequate operational circuit stability.

An advantage of this invention is that no inductors, capacitors, or transformers are required. The use of integrated circuit tèchniques is thereby facilitated.

It is a feature of this invention that the advantages of bridge-stabilization of an output impedance are achieved in a direct-coupled broadband device.

BRIEF DESCRIPTION OF THE DRAWING

The above and other objects, features, and advantages of this invention will be better appreciated by a consideration of the following detailed description and the drawing in which.

DETAILED DESCRIPTION

Figure 1:
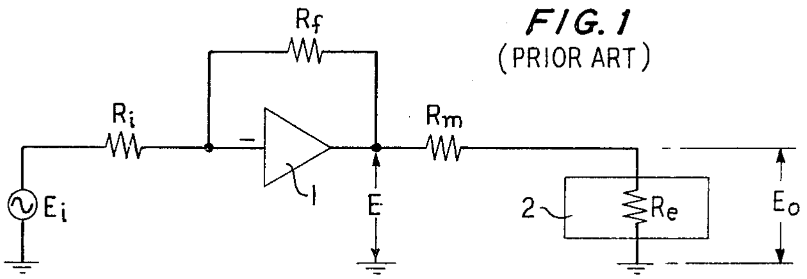
FIG. 1 (PRIOR ART)
FIG. 1 represents an impedance-matching circuit of the prior art.

FIG. 1 shows an impedance-matching arrangement of the prior art. Amplifier 1 is provided with a shunt feedback path between its output and input including resistor $R_f$. The presence of feedback reduces the impedance at the amplifier output to a relatively low value. In order to provide a match with grounded load circuit 2 having a larger impedance $R_e$, a building-out resistance $R_m$, equal to $R_e$, is added in series with the amplifier output. On the other hand, providing amplifier 1 with series feedback, not shown, increases the impedance at the amplifier output to a relatively high value. Therefore, in order to provide a match with grounded load circuit 2 having an impedance $R_e$, a resistance $R_m$, equal to $R_e$, is added in shunt with the amplifier output. Either of these methods is inefficient since one-half of the amplifier's output power is necessarily dissipated in resistor $R_m$.

Figure 2:
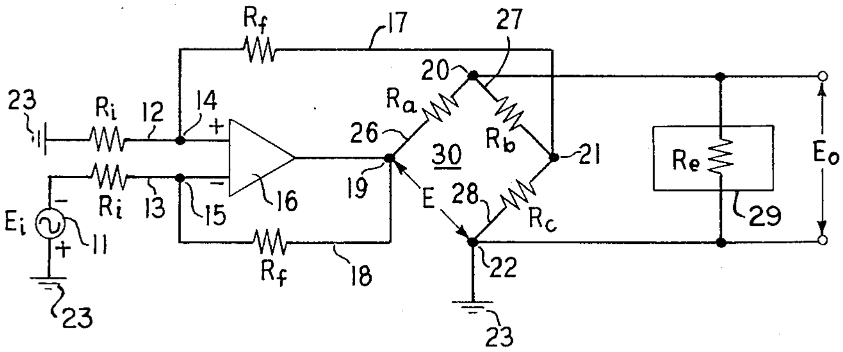
FIG. 2 is a circuit diagram representation of an illustrative embodiment of the bridge-stabilized amplifier according to the present invention.

FIG. 2 shows an embodiment of a bridge-stabilized amplifier according to this invention, including high-gain differential amplifier 16 and quasi-Wheatstone bridge 30. Bridge 30 comprises arms 26 (between junctions 19 and 20), 27 (between junctions 20 and 21), and 28 (between junctions 21 and 22). Arms 26, 27, and 28 respectively include resistances $R_a$, $R_b$, and $R_c$. Junctions 20 and 22 define the load diagonal of bridge 30. The latter terminal is grounded at location 23. Amplifier 16 is provided with respective noninverting and inverting inputs at terminals 14 and 15. Feedback paths 17 and 18, which include resistances $R_f$, extend between the remaining bridge junctions 21 and 19, defining the other bridge diagonal, and amplifier input terminals 14 and 15, respectively. Grounded source circuit 11 for the overall arrangement is buffered from amplifier terminal 15 by path 13 which includes resistance $R_i$. Amplifier input terminal 14 is grounded via line 12, which includes resistance $R_i$, at location 23.

Bridge 30 of FIG. 2 may be thought of as an incomplete Wheatstone bridge three of whose branches comprise resistances $R_a$, $R_b$, and $R_c$, whereas the fourth branch comprises the output impedance of amplifier 16. In order to balance the bridge and achieve conjugacy between the bridge diagonals, the output impedance of amplifier 16 must be related to $R_c$ as the ratio $R_a$:$R_b$. Inasmuch as high-gain operational amplifiers have either low or indeterminate output impedances, virtual bridge conjugacy is achieved by the application of feedback. The fraction of the voltage appearing across series resistances $R_a$ and $R_b$ in bridge 30 becomes a source of feedback currents delivered by way of lines 17 and 18 to differential amplifier input terminals 14 and 15.

With respect to FIG. 2, taking into account the circuit parameters and assuming that gain A of amplifier 16 is large, the output impedance appearing across output diagonal 20–22 of bridge 30 may be expressed as:

$$R_o=\frac{R_a}{R_a+R_b}\left[R_b+\frac{R_c(R_i+R_f)}{R_c+(R_i+R_f)}\right] \quad (1)$$

Equation 1 shows that output impedance $R_o$ is a function of the three bridge resistances modified by the shunting effect of resistances $R_i$ and $R_f$ across resistance $R_c$. Output impedance $R_o$ is independent of amplifier gain A and thus remains substantially constant as long as A is large. This result is important because A itself varies with supply voltage amplitude, temperature, aging of components, and other transitory conditions.

In addition, the circuit gain in terms of $E_i$, $E_o$, and the circuit parameters is expressed as:

$$E_o=\frac{R_oR_e}{R_a}\frac{R_f}{R_i}E_i \quad (2)$$

where again it is assumed that A is large. The term $R_e$ represents the impedance of grounded load circuit 29.

Finally, assuming an impedance match between $R_o$ and $R_e$, the resulting expression for the output voltage $E_o$ is given by:

$$E_o=\frac{R_o^2}{R_a}\frac{R_f}{R_i}E_i \qquad (3)$$

Figure 3:
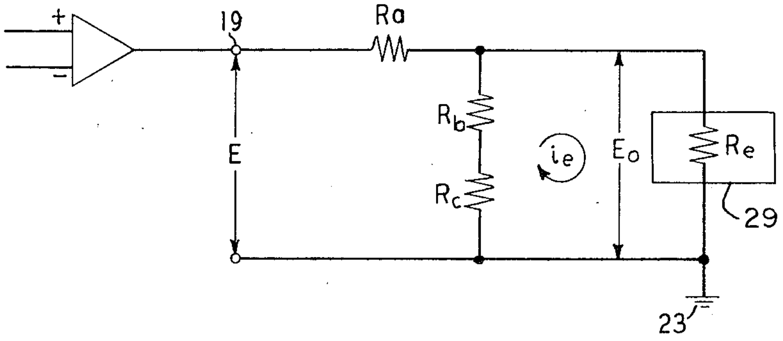
FIG. 3 is a simplified circuit diagram representing the output bridge and is used to explain the minimization of output power loss.

It is now shown that given a particular voltage E at the output of a high-gain amplifier, more useful power is made available to a load impedance using the proposed bridge-stabilized arrangement than with the usual building-out technique. Reference is made to FIG. 3 in which E is the voltage appearing between differential amplifier output terminal 19 and ground 23. The maximum value of E is determined by power supply amplitude and by the maximum capability of the amplifier. It is readily apparent that for the bridge arrangement, the relationship between E and $E_o$ is as follows:

$$E_o=E\frac{R_p}{R_a+R_p} \qquad (4)$$

where $R_p$ represents the combination of $R_b$ in series with $R_c$ which in turn are in parallel with $R_e$. Thus, $$R_p=\frac{R_e(R_b+R_c)}{R_e+(R_b+R_c)} \qquad (5)$$

In deriving equation 4 from FIG. 3, it is assumed that the currents through feedback paths 17 and 18 of FIG. 2 are very small compared to the current $i_e$ through load impedance $R_e$. This assumption is valid since in most modern operational amplifiers the feedback resistances $R_f$ are usually very high.

Now, equation 4 can be rewritten as:

$$E_o=E\frac{R_e}{R_e+R_a\left(1+\frac{R_e}{R_b+R_c}\right)} \qquad (6)$$

Applying the equation for power dissipation $P=V^2/R$ (7) where $P$ is power, $V$ is voltage, and $R$ is resistance, and after simplifying, the power dissipated by load impedance $R_e$ is given by:

$$P(\text{BRIDGE})=\frac{E^2}{\left(1+\frac{R_a}{R_e}+\frac{R_a}{R_b+R_c}\right)^2R_e} \qquad (8)$$

An expression similar to equations 4 and 6 is gotten for the circuit of FIG. 6 where $R_e$ is the impedance of load circuit 2. Such an expression is given by:

$$E_0=E=E\frac{R_e}{R_e+R_m} \qquad (9)$$

The application of equation 7 to equation 9 indicates that the power dissipated by load circuit 2 is:

$$P\ (\text{BUILDING OUT})=\frac{E_0^2}{4R_e} \qquad (10)$$

where it is assumed that $R_m=R_e$. Therefore, from equations 8 and 10 it is apparent that P(BRIDGE) is always greater than P(BUILDING-OUT) whenever:

$$\left(1+\frac{R_a}{R_e}+\frac{R_a}{R_b+R_c}\right)^2<4 \qquad (11)$$

or $$\left(\frac{R_a}{R_e}+\frac{R_a}{R_b+R_c}\right)<1 \qquad (12)$$

By way of example assume that $R_e$=135 ohms. Equation 12 is readily satisfied by letting $R_a$=0.22$R_e$=30 ohms and $R_a$=0.006($R_b$+$R_c$), where $R_b$=620 ohms and $R_c$=4,300 ohms. Applying these values of $R_e$, $R_a$, $R_b$, and $R_c$ to equation 1 yields $R_i$+$R_f$=5,000 ohms, where $R_i$ and $R_f$ can be 3,000 and 2,000 ohms, respectively. Finally, from equations 8 and 10 it is apparent that approximately 2.66 times as much power is made available to load impedance $R_e$ by the bridge arrangement than by the building-out arrangement.

As noted above, the minimization of output power loss is made with respect to E, the amplifier output voltage. Now, regardless of the gain $R_f/R_i$ made available to an amplifier, the value of E is limited. This results from saturation of the amplifier which leads to undesirable nonlinear distortion of the output wave. Therefore, it is shown by the above comparison that for any given value of E up to the maximum value, the bridge-stabilized arrangement makes more power available to load impedance $R_e$ than does the building-out arrangement.

While the arrangement according to this invention for bridge-stabilizing an output impedance has been described in terms of a specific illustrative embodiment, it will be apparent to one skilled in the art that many modifications are possible within the spirit and scope of the described invention.

What is claimed is:

1. An impedance-matching arrangement for directly connecting a grounded source circuit to a grounded load circuit comprising:
   - an amplifier having two inputs and one output,
   - means directly connecting said grounded source circuit to one of said amplifier inputs;
   - an impedance bridge including said amplifier output as one arm thereof;
   - means connecting said amplifier inputs across one diagonal of said bridge;
   - the other diagonal of said bridge being directly connected across said grounded load circuit; and
   - said amplifier providing more than half its output power to said grounded load circuit.

2. The impedance-matching arrangement defined in claim 1 wherein said amplifier is a differential amplifier.

3. The combination comprising:
   - an amplifier having two inputs and one output;
   - an impedance bridge including first, second and third branches;
   - a first junction between said amplifier output and said first branch;
   - a second junction between said first branch and said second branch;
   - a third junction between said second branch and one end of said third branch;
   - first and second feedback means connecting said first and third junctions to said amplifier inputs; and
   - said second junction and the other end of said third branch constituting the output terminals of said circuit.

4. The combination defined in claim 3 further comprising first and second resistance elements respectively in series with said amplifier inputs.

5. The combination defined in claim 4 wherein said first and second resistance elements are of equal value.

6. The combination defined in claim 3 wherein said first and second feedback means respectively include first and second resistance elements.

7. The combination defined in claim 6 wherein said first and second resistance elements are of equal value.

8. The combination defined in claim 3 wherein:
   - said two amplifier inputs further comprise a noninverting input and an inverting input;
   - said first feedback means connects said first junction to said inverting input; and
   - said second feedback means connects said third junction to said noninverting input.

* * * * *

UNITED STATES PATENT OFFICE
CERTIFICATE OF CORRECTION

Patent No. 3,638,133 Dated January 25, 1972

Inventor(s) Stanley Thayer Meyers

It is certified that error appears in the above-identified patent and that said Letters Patent are hereby corrected as shown below:

In the specification, equation (2), at column 2, should read:

$$E_o = \frac{R_o R_e}{R_a (R_o + R_e)} \frac{R_f}{R_i} E_i$$

Further, equation (3), at column 3, should read:

$$E_o = \frac{1}{2} \frac{R_o}{R_a} \frac{R_f}{R_i} E_i$$

Also, at column 3, line 56, "FIG. 6" should read --FIG. 1--.

Finally, equation (9), at column 3, should read:

$$E_o = E \frac{R_e}{R_e + R_m}$$

Signed and sealed this 6th day of February 1973.

(SEAL)
Attest:

EDWARD M.FLETCHER,JR.
Attesting Officer

ROBERT GOTTSCHALK
Commissioner of Patents